United States Patent
Itadani et al.

(10) Patent No.: US 11,009,130 B2
(45) Date of Patent: May 18, 2021

(54) SLIDING COMPONENT

(71) Applicants: EAGLE INDUSTRY CO., LTD., Tokyo (JP); NOK CORPORATION, Tokyo (JP)

(72) Inventors: Masatoshi Itadani, Tokyo (JP); Kazumasa Sunagawa, Tokyo (JP); Tetsuzo Okada, Tokyo (JP); Keiichi Chiba, Tokyo (JP); Kenji Kiryu, Tokyo (JP); Tadahiro Kimura, Tokyo (JP); Akiko Koga, Fujisawa (JP)

(73) Assignees: EAGLE INDUSTRY CO., LTD., Tokyo (JP); NOK CORPORATION, Tokyo (JP)

( * ) Notice: Subject to any disclaimer, the term of this patent is extended or adjusted under 35 U.S.C. 154(b) by 56 days.

(21) Appl. No.: 16/341,413

(22) PCT Filed: Sep. 29, 2017

(86) PCT No.: PCT/JP2017/035394
§ 371 (c)(1),
(2) Date: Apr. 11, 2019

(87) PCT Pub. No.: WO2018/070265
PCT Pub. Date: Apr. 19, 2018

(65) Prior Publication Data
US 2020/0182356 A1 Jun. 11, 2020

(30) Foreign Application Priority Data
Oct. 14, 2016 (JP) .............................. JP2016-202393

(51) Int. Cl.
*F16J 15/3284* (2016.01)
*F16J 15/00* (2006.01)
*F16J 15/3232* (2016.01)

(52) U.S. Cl.
CPC ......... *F16J 15/3284* (2013.01); *F16J 15/002* (2013.01); *F16J 15/3232* (2013.01)

(58) Field of Classification Search
CPC ...... F16J 15/3284; F16J 15/3268; F16J 15/32; F16J 15/3232; F16J 15/00; F16J 15/002;
(Continued)

(56) References Cited

U.S. PATENT DOCUMENTS 5,443,274 A * 8/1995 Fuse .................... F16J 15/3468
277/390
5,501,470 A * 3/1996 Fuse .................... F16J 15/3424
277/400

(Continued)

FOREIGN PATENT DOCUMENTS

JP  H05163495 A  6/1993
JP  H09132478 A  5/1997

(Continued)

OTHER PUBLICATIONS

International Search Report (ISR) dated Nov. 28, 2017, issued for International application No. PCT/JP2017/035394. (2 pages).

*Primary Examiner* — Nathan Cumar
(74) *Attorney, Agent, or Firm* — Law Office of Katsuhiro Arai

(57) ABSTRACT

In an exemplary embodiment, a sliding component includes an annular stationary side seal ring 5 fixed to the stationary side and an annular rotating side seal ring 3 to be rotated together with a rotating shaft, in which by relatively rotating opposing sealing faces S of the stationary side seal ring 5 and the rotating side seal ring 3, a silicate-containing sealed fluid present on one side in the radial direction of the relatively rotating sealing faces S is sealed, wherein an amorphous carbon film 8 formed by using a hydrocarbon gas containing no silicon compound is provided on at least any one of the sealing faces S of the stationary side seal ring 5

(Continued)

and the rotating side seal ring 3, and content of silicon of the amorphous carbon film 8 is 1.5 at % or less.

4 Claims, 9 Drawing Sheets

(58) Field of Classification Search
CPC ........ F16J 15/40; F16J 15/162; F16J 15/3416; F16J 15/3412; F16J 15/3424; F16J 15/3244
USPC ........................................................ 277/351
See application file for complete search history.

(56) References Cited

U.S. PATENT DOCUMENTS

| | | | |
|---|---|---|---|
| 8,814,433 B2 * | 8/2014 | Tokunaga | ............. F16C 17/045 384/123 |
| 2013/0209011 A1 | 8/2013 | Tokunaga | |
| 2018/0010690 A1 | 1/2018 | Itadani et al. | |

FOREIGN PATENT DOCUMENTS

| | | |
|---|---|---|
| JP | H11108199 A | 4/1999 |
| JP | 2006194282 A | 7/2006 |
| JP | 2014185691 A | 10/2014 |
| JP | 5693599 B2 | 4/2015 |
| WO | 2016121739 A1 | 8/2016 |

\* cited by examiner

OPPOSING SLIDING FACE ROTATING DIRECTION ized sealed fluid present on one side in the radial direction of the relatively rotating sealing faces is sealed, characterized in that an amorphous carbon film formed by using a hydrocarbon gas containing no silicon

SLIDING COMPONENT

CROSS-REFERENCE TO RELATED APPLICATIONS

This application is the U.S. National Phase under 35 U.S.C. § 371 of International Application PCT/JP2017/035394, filed Sep. 29, 2017, which claims priority to Japanese Patent Application No. 2016-202393, filed Oct. 14, 2016. The International Application was published under PCT Article 21(2) in a language other than English.

TECHNICAL FIELD

The present invention relates to a sliding component suitable, for example, as a mechanical seal, a bearing, and other sliding units. In particular, the present invention relates to a sliding component such as a seal ring or a bearing that requires reduction of friction by interposing a fluid between sealing faces, and prevention of leakage of the fluid from the sealing faces.

BACKGROUND ART

In order to maintain a sealing property in the long term in a mechanical seal serving as an example of a sliding component, contradictory conditions of "sealing" and "lubrication" have to be compatible with each other. In particular, in recent years, for environmental measures, etc., there is a growing demand to furthermore reduce friction and extend the life while preventing leakage of a sealed fluid.

A method of reducing friction can be achieved by providing a dynamic pressure generation mechanism between sealing faces by rotation, and sliding in a state where a liquid film is interposed, a so-called fluid lubrication state. For example, in Patent Document 1, as an example of the dynamic pressure generation mechanism, a Rayleigh step that generates positive dynamic pressure on the sealing face and a reversed Rayleigh step that generates a negative dynamic pressure are formed, and following relative rotation of a pair of sliding components, positive pressure is generated between the sealing faces by the Rayleigh step, a fluid film is actively interposed between the sealing faces, and the fluid lubrication state is maintained, and negative pressure is generated by the reversed Rayleigh step and leakage is prevented, so that contradictory conditions of "lubrication" and "sealing" are compatible with each other.

Meanwhile, from a viewpoint of extension of the life, carbon, silicon carbide (SiC), cemented carbide, etc. are conventionally used as a sliding material of the mechanical seal. Especially, silicon carbide is often used for the reason that silicon carbide is excellent in corrosion resistance, wear resistance, etc. (for example, see Patent Documents 2 and 3).

Silicon carbide is a favorable material as the sliding material of the mechanical seal but expensive and poor in a machining property. Thus, for cheaper price, more excellent corrosion resistance and wear resistance, and improvement in the machining property, coating of sealing faces of seal rings with diamond-like carbon (hereinafter, sometimes referred to as "DLC") is proposed (for example, see Patent Document 4). Further, there is a known technology that sealing faces of seal rings of a mechanical seal are coated with DLC in order to improve initial fitting between the sealing faces of the seal rings (for example, see Patent Document 5).

CITATION LIST

Patent Documents

Patent Document 1: JP 5693599 B2
Patent Document 2: JP 9-132478 A
Patent Document 3: JP 5-163495 A
Patent Document 4: JP 2014-185691 A
Patent Document 5: JP 11-108199 A

SUMMARY OF THE INVENTION

Technical Problem

For example, a long-life coolant (LLC) which is a type of an anti-freeze is widely used for cooling a water-cooling engine. In a mechanical seal used for a water pump in which the LCC is circulated, it is confirmed that an additive agent of the LLC such as silicate (silicate salt) and phosphoric salt is concentrated over time on sealing faces of the mechanical seal, deposition is generated, and functions of the mechanical seal are possibly lowered. This generation of deposition is thought to be a phenomenon similarly occurring in a mechanical seal for a device that deals with chemicals and oils.

In a case where the sliding component of Patent Document 1 is used for a fluid containing the additive agent of the LLC, silicate (silicate salt), phosphorous salt, etc. is concentrated on the sealing faces and deposited in a Rayleigh step groove and a reversed Rayleigh step groove over time, and functions of the Rayleigh step and the reversed Rayleigh step are possibly inhibited.

Regarding silicon carbide serving as the sliding material of the mechanical seal described in Patent Documents 2 and 3, silicon itself contained in silicon carbide has a high affinity with silicate in the sealed fluid. In a case where the sliding material is silicon carbide, there is a problem that a silicate compound is easily deposited on the sealing faces, smoothness of the sealing faces is lost by deposition, and leakage of the LLC is led.

In Patent Documents 4 and 5 described above, a DLC film is provided for improving wear resistance and improving a fitting property. A high affinity of silicon carbide with silicate in a sealed fluid is not considered. There is similarly a problem that a silicate compound is deposited on the sealing faces over time, smoothness of the sealing faces is lost, and leakage of the LLC is led.

An object of the present invention is to provide a sliding component such as a mechanical seal that seals a silicate-containing sealed fluid such as LLC, the sliding component being capable of preventing a problem that a silicate compound is deposited on sealing faces, smoothness is lost, and thereby leakage of the sealed fluid is led.

Solution to Problem

To attain the above object, a sliding component according to a first aspect of the present invention is a sliding component characterized by including an annular stationary side seal ring fixed to the stationary side and an annular rotating side seal ring to be rotated together with a rotating shaft, in which by relatively rotating opposing sealing faces of the stationary side seal ring and the rotating side seal ring, a silicate-containing sealed fluid present on one side in the radial direction of the relatively rotating sealing faces is sealed, characterized in that an amorphous carbon film formed by using a hydrocarbon gas containing no silicon compound is provided on at least any one of the sealing faces of the stationary side seal ring and the rotating side seal ring, and content of silicon of the amorphous carbon film is 1.5 at % or less.

According to the first aspect, in the sliding component such as a mechanical seal that seals a silicate-added sealed fluid such as LLC, it is possible to prevent leakage of the sealed fluid due to deposition of a silicate compound on the sealing faces and loss of smoothness.

According to a second aspect of the present invention, in the sliding component in the first aspect, a substrate of the stationary side seal ring or the rotating side seal ring is made of silicon carbide.

According to the second aspect, even in a case where silicon carbide which is a favorable material having a good heat release property and excellent wear resistance as a sliding material of the mechanical seal, etc. is used as the substrate of the stationary side seal ring or the rotating side seal ring, it is possible to prevent leakage of the silicate-containing sealed fluid.

According to a third aspect of the present invention, in the sliding component in the first aspect, at least one of the sealing faces of the stationary side seal ring and the rotating side seal ring includes a dynamic pressure generation mechanism that generates dynamic pressure by relative rotation of the stationary side seal ring and the rotating side seal ring.

According to the third aspect, silicate is not deposited on the dynamic pressure generation mechanism provided on at least one of the sealing faces of the stationary side seal ring and the rotating side seal ring, dynamic pressure is generated between the sealing faces, and it is possible to provide the sliding component with low friction and with almost no leakage.

Advantageous Effects of Invention

The present invention achieves the following outstanding effects.
(1) By forming the amorphous carbon film whose content of silicon is 1.5 at % or less on at least any one of the sealing faces of the stationary side seal ring and the rotating side seal ring by using the hydrocarbon gas containing no silicon compound, the sealing face of the stationary side seal ring or the rotating side seal ring has a lower affinity with silicate, and it is possible to prevent deposition of a silicate compound contained in the sealed fluid on the sealing face. Thus, it is possible to maintain smoothness of the sealing face and prevent leakage of the sealed fluid.
(2) Even in a case where silicon carbide which is a favorable material having a good heat release property and excellent wear resistance as the sliding material of the mechanical seal, etc. is used as the substrate of the stationary side seal ring or the rotating side seal ring, it is possible to prevent deposition of a silicate compound contained in the sealed fluid on the sealing face by the amorphous carbon film whose content of silicon is 1.5 at % or less. Thus, it is possible to maintain smoothness of the sealing face and prevent leakage of the silicate-containing sealed fluid.
(3) It is possible to prevent deposition of a silicate compound contained in the sealed fluid by the dynamic pressure generation mechanism formed on at least one of the sealing faces of the stationary side seal ring and the rotating side seal ring with the amorphous carbon film whose content of silicon is 1.5 at % or less. Thus, it is possible to generate dynamic pressure between the sealing faces and make sliding in a low friction and low leakage state without losing functions of the dynamic pressure generation mechanism.

DESCRIPTION OF EMBODIMENTS

Hereinafter, with reference to the drawings, etc., modes for carrying out this invention will be described with examples.

However, the dimensions, the materials, the shapes, the relative arrangements, etc. of constituent components described in the embodiments are not intended to limit the scope of the present invention only to them unless otherwise described explicitly.

Figure 1:
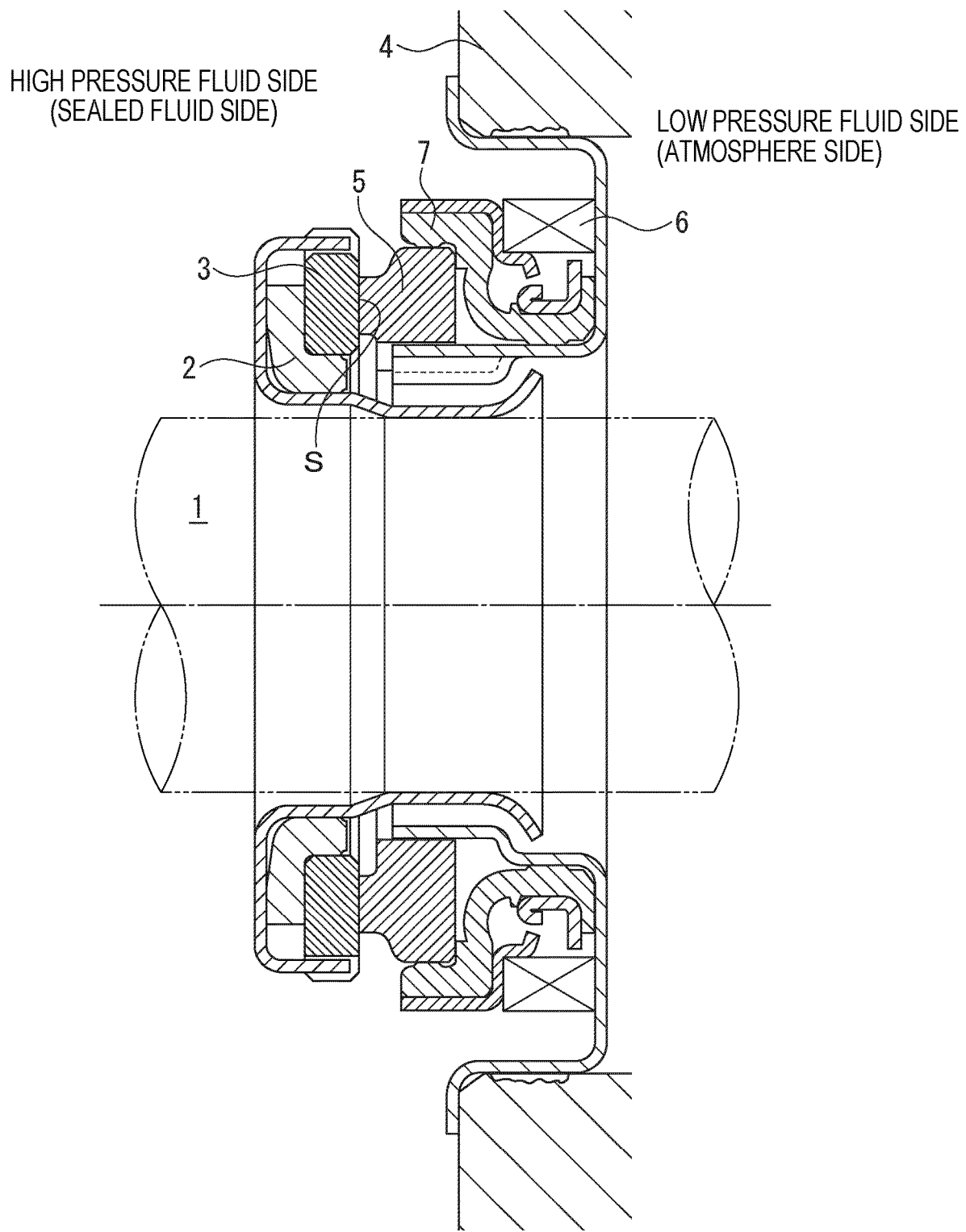
FIG. 1 is a vertically sectional view showing an example of a mechanical seal according to Example 1 of the present invention.
Figure 2:
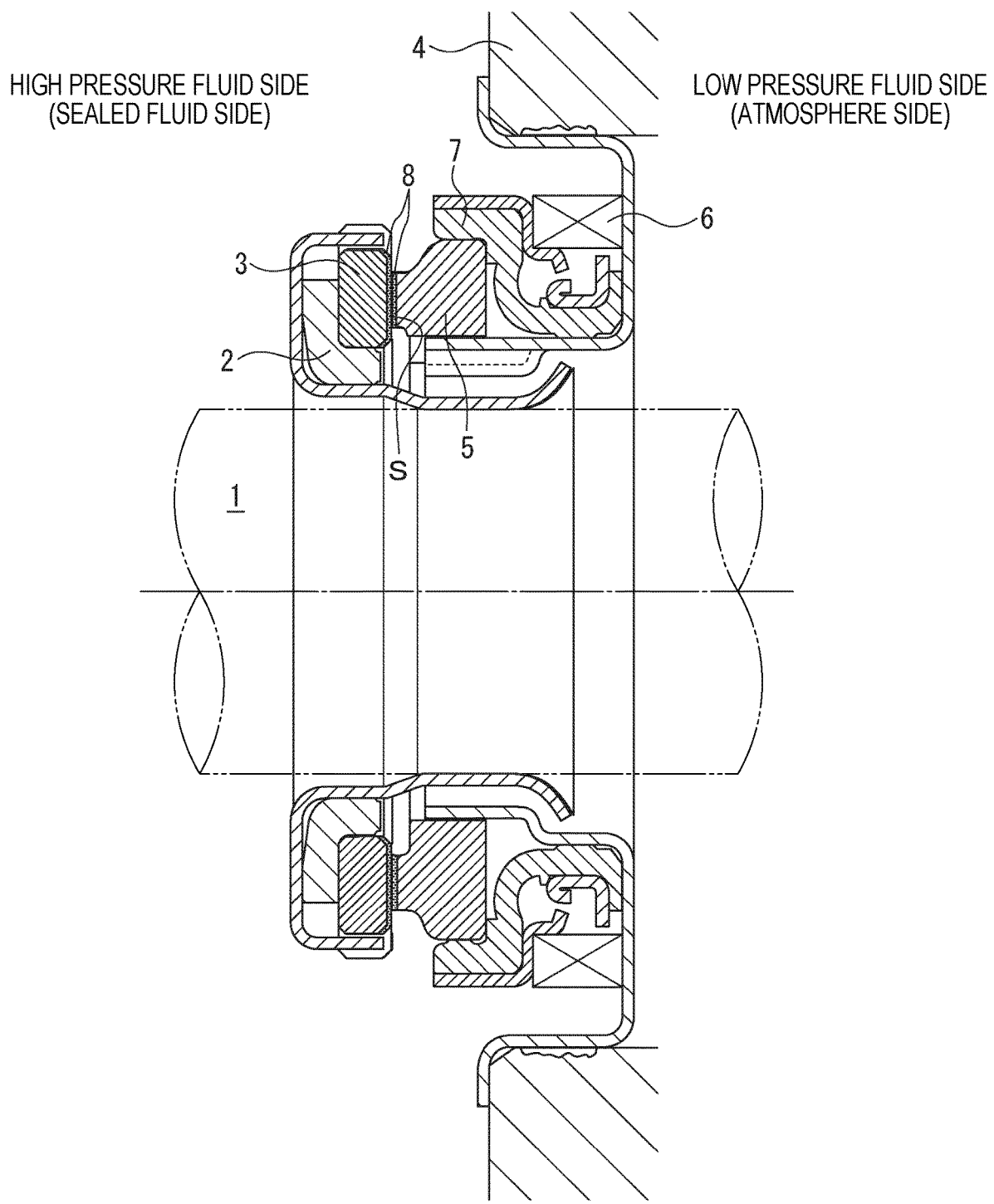
FIG. 2 is an enlarged view of major parts of FIG. 1, showing a state where DLC films are laminated on sealing faces of substrates of a stationary side seal ring and a rotating side seal ring.

With reference to FIGS. 1 and 2, a sliding component of the present invention will be described.

In the present embodiment, as an example, a mechanical seal that is an example of the sliding component will be described. The outer peripheral side of a sliding component forming the mechanical seal will be described as the high pressure fluid side (sealed fluid side), and the inner peripheral side as the low pressure fluid side (atmosphere side). The present invention is not limited to this but is applicable to the case where the high pressure fluid side and the low pressure fluid side are reversed.

FIG. 1 is a vertically sectional view showing an example of the mechanical seal, which is an inside mechanical seal in the form of sealing a sealed fluid on the high pressure fluid side to leak from the outer periphery of sealing faces toward the inner periphery. The mechanical seal is provided with an annular rotating side seal ring 3 serving as one sliding component provided across a sleeve 2 on the side of a rotating shaft 1 that drives a pump impeller (not shown) on the high pressure fluid side in a state where the rotating side seal ring is rotatable integrally with this rotating shaft 1, and an annular stationary side seal ring 5 serving as the other sliding component provided in a housing 4 of a pump in a non-rotating state and an axially movable state. With a coiled wave spring 6 and a bellows 7 axially biasing the stationary side seal ring 5, the seal rings slide with close contact with each other at sealing faces S. That is, this mechanical seal prevents an outflow of the sealed fluid from the outer periphery of the rotating shaft 1 to the atmosphere side at the sealing faces S of the rotating side seal ring 3 and the stationary side seal ring 5.

FIG. 1 shows a case where width of the sealing face of the rotating side seal ring 3 is greater than width of the sealing face of the stationary side seal ring 5. However, the present invention is not limited to this but is also applicable to the opposite case as a matter of course.

The sealed fluid is a silicate-containing fluid such as LLC to which silicate is added.

The material of the rotating side seal ring 3 and the stationary side seal ring 5 is typically selected from carbon excellent in self-lubricity, silicon carbide (SiC) excellent in wear resistance, etc. For example, both the seal rings can be made of silicon carbide or the rotating side seal ring 3 of silicon carbide and the stationary side seal ring 5 of carbon can be combined.

In particular, silicon carbide is known to be a favorable material having a good heat release property and excellent wear resistance as a sliding material of the mechanical seal, etc. However, as described above, silicon itself contained in silicon carbide has a high affinity with silicate in the sealed fluid. Therefore, when the sliding component made of silicon carbide is used for sealing a fluid containing a silicate compound such as LLC, there is a problem that silicate is deposited on and attached to the sealing faces, smoothness of the sealing faces is lost, and leakage of the LLC is led.

Conventionally, surfaces of sliding materials of the mechanical seal are coated with DLC films for improving wear resistance, improving a fitting property, and lowering a friction coefficient, and the DLC films contain silicon. However, a high affinity of silicon contained in the DLC films with a silicate compound is not considered at all. Thus, there is a problem that a silicate compound contained in the sealed fluid is deposited on and attached to the DLC films containing silicon, smoothness of the sealing faces is lost, and leakage of the LLC is led.

Therefore, in the present invention, an amorphous carbon film formed by using a hydrocarbon gas (source gas) containing no silicon compound in the plasma CVD method (chemical vapor deposition) is laminated on at least any one of the sealing faces S of the rotating side seal ring 3 and the stationary side seal ring 5. That is, it is a characteristic that the amorphous carbon film of the present invention contains as less silicon as possible.

As described later, even in a case where the film is formed by using a hydrocarbon gas containing no silicon compound, an extremely small amount of silicon based on a substrate may sometimes be contained in the amorphous carbon film. The amorphous carbon film is a carbon film of an amorphous structure (non-crystalline structure) in which carbon having sp3 bond corresponding to a diamond structure and carbon having sp2 bond corresponding to a graphite structure are mixed irregularly. The amorphous carbon film is generally called as diamond-like carbon (DLC).

In the present embodiment, as shown in FIG. 2, an amorphous carbon film 8 formed by using a hydrocarbon gas containing no silicon compound is laminated on the sealing faces S of the rotating side seal ring 3 and the stationary side seal ring 5. This amorphous carbon film 8 is formed by the plasma CVD method (chemical vapor deposition) such as the DC plasma CVD method.

In this plasma CVD method, while introducing the source gas consisting of a hydrocarbon gas such as an acetylene gas, an ethylene gas, a propylene gas, and a methane gas into a processing chamber that houses substrates of the rotating side seal ring 3 and the stationary side seal ring 5, electrons having energy of ionization voltage or more collides with the source gas, so that chemically active ions are generated. Thereby, the plasma source gas is present around surfaces of the substrates of the rotating side seal ring 3 and the stationary side seal ring 5. At this time, the plasma source gas is laminated on the substrates of the rotating side seal ring 3 and the stationary side seal ring 5 arranged on the electrode side, so that the amorphous carbon film 8 is formed.

At that time, no silicon compound is contained at all in the source gas consisting of a hydrocarbon gas such as an ethylene gas and a propylene gas. Thus, the formed amorphous carbon film 8 contains almost no silicon. Therefore, the rotating side seal ring 3 and the stationary side seal ring 5 are coated with the amorphous carbon film 8 containing no silicon. Thus, the sealing faces of the stationary side seal ring and the rotating side seal ring have almost no affinity with silicate, and it is possible to prevent deposition and attachment of a silicate compound contained in the sealed fluid onto the sealing faces.

In a case where the material of the substrates of the rotating side seal ring 3 and the stationary side seal ring 5 contains silicon such as silicon carbide, and even in a case where a silicon compound is not contained in the source gas, a silicon component is emitted from the substrates of silicon carbide as outgassing by plasma treatment. Therefore, a small amount of silicon is contained in the formed amorphous carbon film 8.

However, even in that case, when content of silicon in the formed amorphous carbon film 8 is 1.5 at % or less, it is possible to prevent deposition of a silicate compound contained in the sealed fluid on the sealing faces, maintain smoothness of the sealing faces, and prevent leakage of the sealed fluid.

The amorphous carbon film 8 contains 1 at % to 20 at % of hydrogen for improving adhesiveness to the substrates. Thereby, the amorphous carbon film 8 is less easily detached from the substrates, and it is possible to prevent exposure of the substrates containing silicon. Thus, it is possible to prevent deposition of a silicate compound contained in the sealed fluid on the sealing faces, maintain smoothness of the sealing faces, and prevent leakage of the sealed fluid.

Hereinafter, the present invention will be described in more detail with Examples. However, the present invention is not restricted by these Examples.

Other terms and concepts in the present invention are based on the meanings of terms customarily used in this field. Various technologies used for implementing the present invention can be easily and reliably implemented by those skilled in the art based on the known documents, etc. except the technologies which are particularly clearly sourced.

Example 1

The sealing faces S of the annular substrates made of silicon carbide formed for the rotating side seal ring 3 and the stationary side seal ring 5 were processed to be smooth by lapping. In a plasma CVD device, by using a hydrocarbon gas containing no silicon compound, an amorphous carbon film having thickness of 150 nm was laminated on the sealing faces S of the substrates of the rotating side seal ring 3 and the stationary side seal ring 5, and a sliding test was conducted under the following sliding test conditions.

In this case, content of silicon emitted from the substrates made of silicon carbide as outgassing by plasma treatment and contained in the amorphous carbon film was 0.07 at %.

The content of silicon in the amorphous carbon film was determined by performing narrow measurement on a smooth portion where a dynamic pressure generation groove, etc. are not processed by the X ray photoelectron spectroscopy (XPS) (PHI Quantera SXM by ULVAC-PHI, INCORPORATED.) The film thickness was determined by making a cross section with a cross section polisher (CP) and observing with FE-SEM (SU8220 by Hitachi, Ltd.)

Sliding Test Condition
a sealing face pressure: 0.3 MPa
b sealed fluid: silicate-containing LLC 50 wt % solution
c pressure of sealed fluid: 0.1 MPaG
d circumferential speed: between 0 m/s (3 seconds) and 1 m/s (3 seconds)
e test time: 550 hours
A result of the sliding test will be shown in Table 1.

Example 2

In the state of Example 1, the amorphous carbon film was laminated only on the sealing face S of the substrate of the stationary side seal ring 5. A result of the test conducted under the sliding test conditions of Example 1 will be shown in Table 1.

Example 3

In the state of Example 1, by using a hydrocarbon gas containing no silicon compound, an amorphous carbon film whose content of silicon is 0.24 at % and film thickness is 150 nm was laminated on the sealing faces S of the substrates of the rotating side seal ring 3 and the stationary side seal ring 5. A result of the test conducted under the sliding test conditions of Example 1 will be shown in Table 1.

Example 4

In the state of Example 3, the amorphous carbon film was laminated only on the sealing face S of the substrate of the stationary side seal ring 5. A result of the test conducted under the sliding test conditions of Example 1 will be shown in Table 1.

Example 5

In the state of Example 1, by using a hydrocarbon gas containing no silicon compound, an amorphous carbon film whose content of silicon is 0.67 at % and film thickness is 150 nm was laminated on the sealing faces S of the substrates of the rotating side seal ring 3 and the stationary side seal ring 5. A result of the test conducted under the sliding test conditions of Example 1 will be shown in Table 1.

Example 6

In the state of Example 5, the amorphous carbon film was laminated only on the sealing face S of the substrate of the stationary side seal ring 5. A result of the test conducted under the sliding test conditions of Example 1 will be shown in Table 1.

Example 7

In the state of Example 1, by using a hydrocarbon gas containing no silicon compound, an amorphous carbon film whose content of silicon is 1.5 at % and film thickness is 150 nm was laminated on the sealing faces S of the substrates of the rotating side seal ring 3 and the stationary side seal ring 5. A result of the test conducted under the sliding test conditions of Example 1 will be shown in Table 1.

Example 8

In the state of Example 7, the amorphous carbon film was laminated only on the sealing face S of the substrate of the stationary side seal ring 5. A result of the test conducted under the sliding test conditions of Example 1 will be shown in Table 1.

Example 9

The sealing faces S of the annular substrates made of silicon carbide formed for the rotating side seal ring 3 and a stationary side seal ring 15 were processed to be smooth by lapping. Dynamic pressure generation mechanisms shown in FIG. 3 were processed on the lapped sealing face S of the stationary side seal ring 15. Next, in the plasma CVD device, by using a hydrocarbon gas containing no silicon compound, an amorphous carbon film whose content of silicon is 0.07 at % and thickness is 150 nm was laminated on the sealing faces S of the substrates of the rotating side seal ring 3 and the stationary side seal ring 15. A result of the test conducted under the sliding test conditions of Example 1 will be shown in Table 1.

Figure 3:
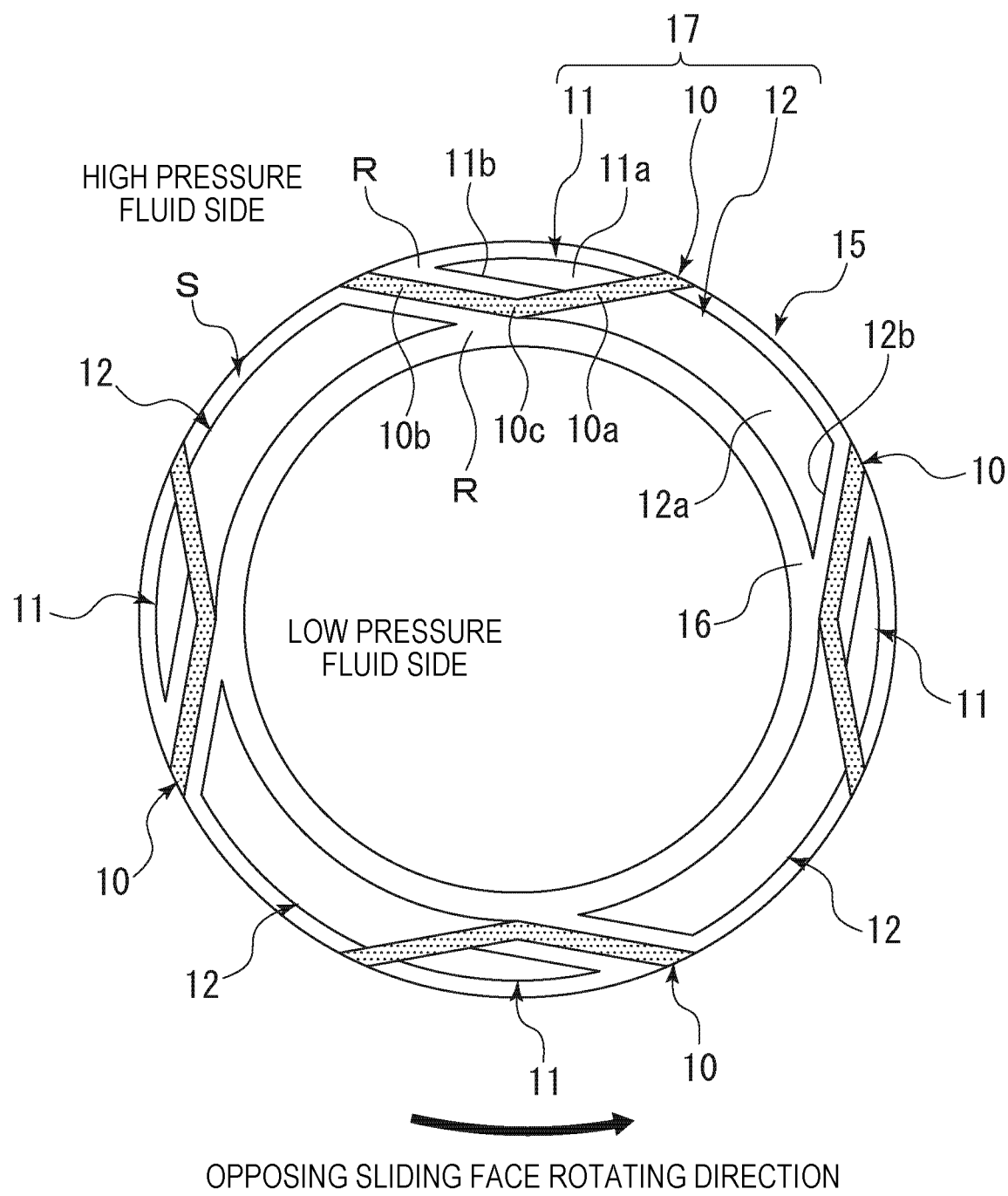
FIG. 3 is a view showing an embodiment in which four dynamic pressure generation mechanisms each of which includes a positive pressure generation mechanism and a negative pressure generation mechanism extending in the opposite directions to each other across a fluid circulation groove are arranged on the sealing face of the stationary side seal ring.

The dynamic pressure generation mechanisms 17 shown in FIG. 3 will be described. In FIG. 3, the outer peripheral side of the sealing face S of the stationary side seal ring 15 is the high pressure fluid side, the inner peripheral side is the low pressure fluid side, for example, the atmosphere side, and the opposing sealing face is rotated in the anti-clockwise direction. As shown in FIG. 3, the four dynamic pressure generation mechanisms 17 are processed on the sealing face S of the stationary side seal ring 15 equally in the circumferential direction. Each of the dynamic pressure generation mechanisms 17 is formed by a fluid circulation groove 10, and a positive pressure generation mechanism 11 and a negative pressure generation mechanism 12 communicating with the fluid circulation groove 10, the pressure generation mechanisms being circumferentially provided in the opposite directions to each other across the fluid circulation groove 10.

The fluid circulation groove 10 is formed by an inlet portion 10a and an outlet portion 10b communicating with a pair of opening portions opened on a peripheral surface of the stationary side seal ring 15 on the high pressure fluid side, and a communication portion 10c providing communication between the inlet portion 10a and the outlet portion 10b in the circumferential direction, and isolated from the low pressure fluid side by a land portion R. The fluid circulation groove 10 plays a role of actively introducing the sealed fluid from the high pressure fluid side onto the sealing face and discharging in order to prevent concentration of a fluid containing corrosion products, etc. on the sealing face, and the inlet portion 10a and the outlet portion 10b are formed so that the sealed fluid is easily taken in on the sealing face and discharged in accordance with the rotating direction of the opposing sealing face. Meanwhile, in order to reduce leakage, the fluid circulation groove is isolated from the low pressure fluid side by the land portion R.

In a part surrounded by the fluid circulation groove 10 and the high pressure fluid side, the positive pressure generation mechanism 11 shallower than the fluid circulation groove 10 is provided. The positive pressure generation mechanism 11 is formed by a Rayleigh step mechanism including a positive pressure generation groove 11a communicating with the inlet portion 10a of the fluid circulation groove 10 and a Rayleigh step 11b. By generating positive pressure (dynamic pressure), the positive pressure generation mechanism 11 increases a fluid film between the sealing faces, and improves a lubrication performance. The positive pressure generation groove 11a communicates with the inlet portion of the fluid circulation groove 10, and is isolated from the outlet portion 10b and the high pressure fluid side by the land portion R.

Further, on the outside of the part surrounded by the fluid circulation groove 10 and the high pressure fluid side, that is, on the low pressure side in the radial direction of the sealing face between the adjacent fluid circulation grooves 10, 10, the negative pressure generation mechanism 12 shallower than the fluid circulation groove 10 is provided. The negative pressure generation mechanism 12 is formed by a negative pressure generation groove 12a communicating with the inlet portion 10a of the fluid circulation groove 10 and a reversed Rayleigh step 12b. The negative pressure generation groove 12a is isolated from the low pressure fluid side by the land portion R, and the reversed Rayleigh step 12b on the upstream side is isolated from the fluid circulation groove 10 on the upstream side by the land portion R.

By generating negative pressure (dynamic pressure), the reversed Rayleigh step 12b forming the negative pressure generation mechanism 12 plays a role of taking in the sealed fluid to leak from the high pressure fluid side to the low pressure fluid side to the negative pressure generation groove 12a, returning the sealed fluid to the high pressure fluid side via the fluid circulation groove 10, and improving a sealing property. The reversed Rayleigh step prevents leakage between the fluid circulation grooves 10 and 10 and improves the sealing property of the entire sealing face. The width of the positive pressure generation groove 11a and the negative pressure generation groove 12a is set to be 20 to 60% of the sealing face width, and the width of a seal face 16 on the inner peripheral side is set to be 10 to 25% of the sealing face width. As an example, in a case where the diameter of the sliding component is about 20 mm and the sealing face width is about 2 mm, the width of the positive pressure generation groove 11a and the negative pressure generation groove 12a is 0.4 to 1.2 mm, depth is several hundreds of nano to 1 μm, and the width of the seal face 16 on the inner peripheral side is 0.2 to 0.5 mm. The width of the fluid circulation groove 10 is sufficient width to circulate the fluid of high pressure, and the depth is several tens of μm to several hundreds of μm.

When the rotating side seal ring 3 facing the stationary side seal ring 15 is rotated and moved in the direction of an arrow shown in FIG. 3, cavitation due to a pressure decrease is generated in the negative pressure generation mechanism 12. In a negative pressure region where cavitation is generated, silicate precipitate is easily accumulated. When silicon carbide of the substrate is exposed in the negative pressure region, silicate precipitate is easily deposited and attached. As a result, the sealing face S is damaged by deposition, precipitate is deposited on and attached to the positive pressure generation mechanism 11 and the negative pressure generation mechanism 12, and functions of the positive pressure generation mechanism 11 and the negative pressure generation mechanism 12 are deteriorated, to be a factor to lower the sealing property. By coating the rotating side seal ring 3 and the stationary side seal ring 15 with the amorphous carbon film 8 whose content of silicon is 1.5 at % or less, the stationary side seal ring 15 and the rotating side seal ring 3 have almost no affinity with silicate, and deposition and attachment of a silicate compound contained in the sealed fluid onto the sealing face is prevented.

Example 10

In the state of Example 9, by using a hydrocarbon gas containing no silicon compound, an amorphous carbon film whose content of silicon is 0.24 at % and film thickness is 150 nm was laminated on the sealing faces S of the substrates of the rotating side seal ring 3 and the stationary side seal ring 15. A result of the test conducted under the sliding test conditions of Example 1 will be shown in Table 1.

Example 11

In the state of Example 9, by using a hydrocarbon gas containing no silicon compound, an amorphous carbon film whose content of silicon is 0.67 at % and film thickness is 150 nm was laminated on the sealing faces S of the substrates of the rotating side seal ring 3 and the stationary side seal ring 15. A result of the test conducted under the sliding test conditions of Example 1 will be shown in Table 1.

Example 12

In the state of Example 9, by using a hydrocarbon gas containing no silicon compound, an amorphous carbon film whose content of silicon is 1.5 at % and film thickness is 150 nm was laminated on the sealing faces S of the substrates of the rotating side seal ring 3 and the stationary side seal ring 15. A result of the test conducted under the sliding test conditions of Example 1 will be shown in Table 1.

Next, Comparative Examples will be described.

Comparative Example 1

After the sealing faces S of the annular substrates made of silicon carbide formed for the rotating side seal ring 3 and the stationary side seal ring 5 were processed to be smooth by lapping, without processing the positive pressure generation mechanisms 11 and the negative pressure generation mechanisms 12 on the sealing face S of the stationary side seal ring, in the plasma CVD device, by using a hydrocarbon gas containing a silicon compound, an amorphous carbon film whose content of silicon is 1.7 at % and film thickness is 150 nm was laminated on the sealing faces S of the substrates of the rotating side seal ring 3 and the stationary side seal ring 5. A result of the test conducted under the sliding test conditions of Example 1 will be shown in Table 2.

Comparative Example 2

In the state of Comparative Example 1, the amorphous carbon film was laminated only on the sealing face S of the substrate of the stationary side seal ring 5, and the test was conducted under the sliding test conditions of Example 1. A sliding test result will be shown in Table 2.

Comparative Example 3

In the state of Comparative Example 1, by using a hydrocarbon gas containing a silicon compound, an amorphous carbon film whose content of silicon is 3.96 at % and film thickness is 150 nm was laminated on the sealing faces S of the substrates of the rotating side seal ring 3 and the stationary side seal ring 5. A result of the test conducted under the sliding test conditions of Example 1 will be shown in Table 2.

Comparative Example 4

In the state of Comparative Example 3, the amorphous carbon film was laminated only on the sealing face S of the substrate of the stationary side seal ring 5. A result of the test conducted under the sliding test conditions of Example 1 will be shown in Table 2.

Comparative Example 5

In the state of Comparative Example 1, by using a hydrocarbon gas containing a silicon compound, an amorphous carbon film whose content of silicon is 25.1 at % and film thickness is 150 nm was laminated on the sealing faces S of the substrates of the rotating side seal ring 3 and the stationary side seal ring 5. A result of the test conducted under the sliding test conditions of Example 1 will be shown in Table 2.

Comparative Example 6

In the state of Comparative Example 5, the amorphous carbon film was laminated only on the sealing face S of the substrate of the stationary side seal ring 5. A result of the test conducted under the sliding test conditions of Example 1 will be shown in Table 2.

Comparative Example 7

The sealing faces S of the annular substrates made of silicon carbide formed for the rotating side seal ring 3 and the stationary side seal ring 15 were processed to be smooth by lapping. The dynamic pressure generation mechanisms shown in FIG. 3 were processed on the lapped sealing face S of the stationary side seal ring. Next, in the plasma CVD device, by using a hydrocarbon gas containing a silicon compound, an amorphous carbon film whose content of silicon is 1.7 at % and film thickness is 150 nm was laminated on the sealing faces S of the substrates of the rotating side seal ring 3 and the stationary side seal ring 15. A result of the test conducted under the sliding test conditions of Example 1 will be shown in Table 2.

Comparative Example 8

In the state of Comparative Example 7, an amorphous carbon film whose content of silicon is 3.96 at % and film thickness is 150 nm was laminated on the sealing faces S of the substrates of the rotating side seal ring 3 and the stationary side seal ring 15. A result of the test conducted under the sliding test conditions of Example 1 will be shown in Table 2.

Comparative Example 9

In the state of Comparative Example 7, an amorphous carbon film whose content of silicon is 25.1 at % and film thickness is 150 nm was laminated on the sealing faces S of the substrates of the rotating side seal ring 3 and the stationary side seal ring 15. A result of the test conducted under the sliding test conditions of Example 1 will be shown in Table 2.

Table 1 shows the sliding test results of Examples 1 to 12. In Examples 1 to 12, in the plasma CVD device, by using a hydrocarbon gas containing no silicon compound, the amorphous carbon film whose content of silicon is 1.5 at % or less was laminated on at least one of the sealing faces S of the substrates of the rotating side seal ring 3 and the stationary side seal ring 5, 15. As a result of the sliding tests, leakage observed so far during a test time of 550 hours was only vapor leakage, and no leakage due to deposition of a silicate compound was found.

TABLE 1

| | Ex. 1 | Ex. 2 | Ex. 3 | Ex. 4 |
|---|---|---|---|---|
| Si content (at %) | 0.07 | 0.07 | 0.24 | 0.24 |
| Film formation on stationary side seal ring | YES | YES | YES | YES |
| Film formation on rotating side seal ring | YES | NO | YES | NO |
| Dynamic pressure generation groove | NO | NO | NO | NO |
| Test time (H) | 550 | 550 | 550 | 550 |
| Accumulated leakage amount (ml) | 2.5 | 2.5 | 2.7 | 2.7 |

| | Ex. 5 | Ex. 6 | Ex. 7 | Ex. 8 |
|---|---|---|---|---|
| Si content (at %) | 0.67 | 0.67 | 1.5 | 1.5 |
| Film formation on stationary side seal ring | YES | YES | YES | YES |
| Film formation on rotating side seal ring | YES | NO | YES | NO |
| Dynamic pressure generation groove | NO | NO | NO | NO |
| Test time (H) | 550 | 550 | 550 | 550 |
| Accumulated leakage amount (ml) | 2.7 | 2.7 | 2.8 | 2.8 |

| | Ex. 9 | Ex. 10 | Ex. 11 | Ex. 12 |
|---|---|---|---|---|
| Si content (at %) | 0.07 | 0.24 | 0.67 | 1.5 |
| Film formation on | YES | YES | YES | YES |

TABLE 1-continued

| | | | | |
|---|---|---|---|---|
| stationary side seal ring | | | | |
| Film formation on rotating side | YES | YES | YES | YES |
| seal ring | | | | |
| Dynamic pressure generation groove | YES | YES | YES | YES |
| Test time (H) | 550 | 550 | 550 | 550 |
| Accumulated leakage amount (ml) | 2.0 | 2.2 | 2.2 | 2.5 |

(Note)
In Examples 1 to 12, leakage observed so far during the test of 550 hours was only vapor leakage, and no leakage due to deposition of a silicate compound was found.

Meanwhile, Table 2 shows the sliding test results of Comparative Examples 1 to 9. In Comparative Examples 1 to 9, in the plasma CVD device, by using a hydrocarbon gas containing a silicon compound, an amorphous carbon film whose content of silicon exceeds 1.5 at % was laminated on at least one of the sealing faces S of the substrates of the rotating side seal ring 3 and the stationary side seal ring 5, 15. As a result of the sliding tests, leakage occurred in a short time. As well as Examples 1 to 12, the test time was scheduled to be 550 hours in Comparative Examples 1 to 9. However, within 25 hours after start of the tests, color leakage specific to deposition of a silicate compound occurred, and it was unable to continue the tests. Thus, the tests were ended for test times shown in Table 2.

TABLE 2

| | Com. Ex. 1 | Com. Ex. 2 | Com. Ex. 3 | Com. Ex. 4 |
|---|---|---|---|---|
| Si content (at %) | 1.7 | 1.7 | 3.96 | 3.96 |
| Film formation on stationary side seal ring | YES | YES | YES | YES |
| Film formation on rotating side seal ring | YES | NO | YES | NO |
| Dynamic pressure generation groove | NO | NO | NO | NO |
| Test time (H) | 24 | 24 | 24 | 24 |
| Accumulated leakage amount (ml) | 2.2 | 2.2 | 5.3 | 5.3 |

| | Com. Ex. 5 | Com. Ex. 6 | Com. Ex. 7 | Com. Ex. 8 |
|---|---|---|---|---|
| Si content (at %) | 25.1 | 25.1 | 1.7 | 3.96 |
| Film formation on stationary side seal ring | YES | YES | YES | YES |
| Film formation on rotating side seal ring | YES | NO | YES | YES |
| Dynamic pressure generation groove | NO | NO | YES | YES |
| Test time (H) | 11 | 11 | 11 | 24 |
| Accumulated leakage amount (ml) | 6.7 | 6.7 | 2.7 | 4.8 |

| | Com. Ex. 9 |
|---|---|
| Si content (at %) | 25.1 |
| Film formation on stationary side seal ring | YES |
| Film formation on rotating side seal ring | YES |
| Dynamic pressure generation groove | YES |
| Test time (H) | 11 |
| Accumulated leakage amount (ml) | 6.2 |

(Note)
The test time was scheduled to be 550 hours. However, in Comparative Examples 1 to 9, color leakage occurred in a short time after the start of the tests, and it was unable to continue the tests. Thus, the tests were ended for the test times shown in Table 2.

Figure 4:
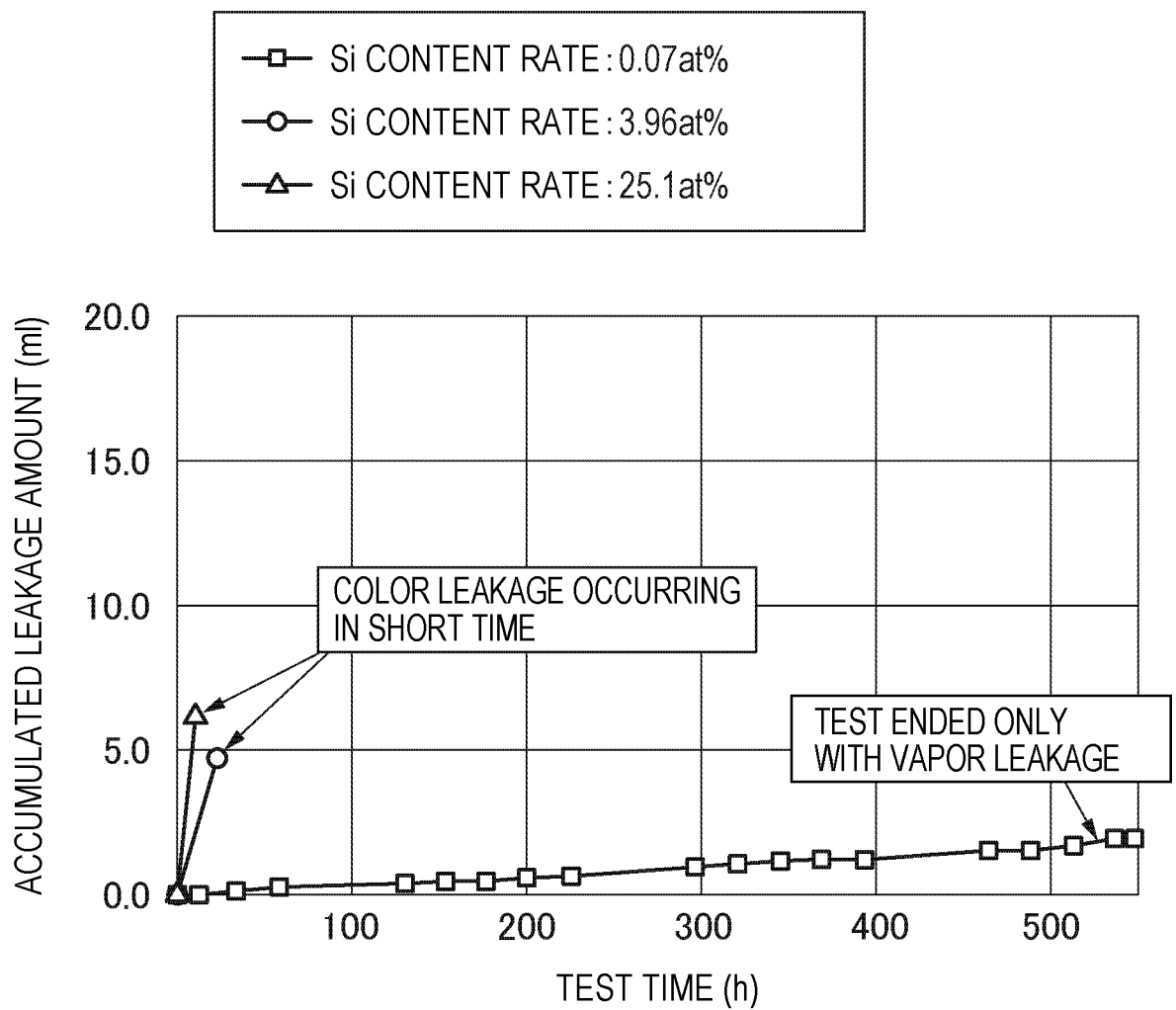
FIG. 4 is a graph in which test results of Example 9 and Comparative Examples 8 and 9 are compared.

FIG. 4 is a graph showing an example of the test results in which Example 9 and Comparative Examples 8 and 9 are compared. In Example 9 and Comparative Examples 8 and 9, the shapes of the rotating side seal ring 3 and the stationary side seal ring 15 are the same, and the shapes, the dimensions, and the number of the positive pressure generation mechanisms 11 and the negative pressure generation mechanisms 12 formed on the sealing face S of the stationary side seal ring 15 are also the same. However, although in Example 9, by using a hydrocarbon gas containing no silicon compound, the amorphous carbon film whose content of silicon is 0.07 at % was laminated on at least one of the sealing faces S of the substrates of the rotating side seal ring 3 and the stationary side seal ring 15, in Comparative Examples 8 and 9, by using a hydrocarbon gas containing a silicon compound, the amorphous carbon films whose content of silicon are 3.96 at % and 25.1 at % respectively were laminated on at least one of the sealing faces S of the substrates of the rotating side seal ring 3 and the stationary side seal ring 15. As shown in FIG. 4, although the line inclines moderately in relation to the test time and only vapor leakage was observed in Example 9, color leakage specific to leakage due to deposition of a silicate compound occurred in a short time after the start of the tests and the leakage occurred so that it was unable to continue the tests in Comparative Examples 8 and 9. It is found that a leakage amount was greater in Comparative Example 9 where content of silicon in the amorphous carbon film is more than Comparative Example 8. In such a way, by coating the rotating side seal ring and the stationary side seal ring with the amorphous carbon film 8 containing almost no silicon, even when the stationary side seal ring and the rotating side seal ring are made of silicon carbide, there is almost no affinity with silicate, and it is possible to prevent deposition of a silicate compound contained in the sealed fluid on the sealing faces. Thus, it is possible to maintain smoothness of the sealing faces and prevent leakage of the sealed fluid.

Further, in Examples 7, 8, and 12, by using the hydrocarbon gas containing no silicon compound, the amorphous carbon film whose content of silicon is 1.5 at % was laminated on at least one of the sealing faces S of the substrates of the rotating side seal ring 3 and the stationary side seal ring 5, 15, and the sliding tests were conducted. As a result, in Examples 7, 8, and 12, it is also confirmed that leakage due to deposition of a silicate compound did not occur. Meanwhile, in Comparative Examples 1, 2, and 7, by using the hydrocarbon gas containing a silicon compound, the amorphous carbon film whose content of silicon is 1.7 at % was laminated on at least one of the sealing faces S of the substrates of the rotating side seal ring 3 and the stationary side seal ring 5, 15. As a result of the sliding tests, it is confirmed that leakage due to deposition of a silicate compound occurred. Thereby, it is confirmed that occurrence of leakage due to deposition of a silicate compound depends on whether or not content of silicon exceeds 1.5 at %.

The present invention is described above with Examples and the drawings. However, specific configurations are not limited to these, and the present invention also includes changes and additions within the range not departing from the gist of the present invention.

Figure 5:
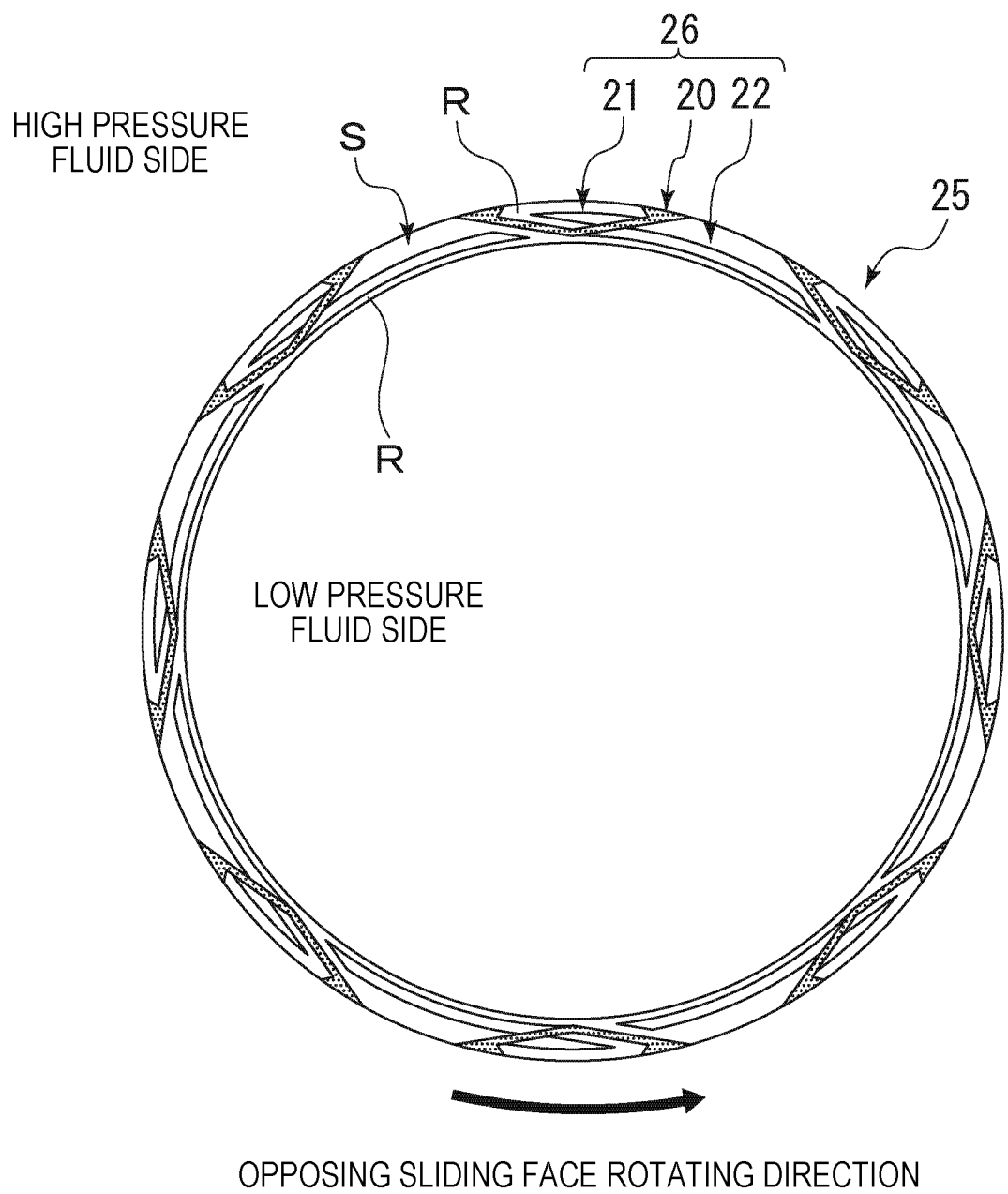
FIG. 5 is a view showing an embodiment in which eight dynamic pressure generation mechanisms each of which includes a positive pressure generation mechanism and a negative pressure generation mechanism extending in the opposite directions to each other across a fluid circulation groove are arranged on a sealing face of a stationary side seal ring.

In FIG. 3 of the above embodiment, the four dynamic pressure generation mechanisms 17 each of which includes the positive pressure generation mechanism 11 and the negative pressure generation mechanism circumferentially extending in the opposite directions to each other across the fluid circulation groove 10 are formed on the sealing face S. However, the present invention is not limited to this. For example, as shown in FIG. 5, eight dynamic pressure generation mechanisms 26 each of which includes a fluid circulation groove 20, and a positive pressure generation mechanism 21 and a negative pressure generation mechanism 22 circumferentially provided in the opposite directions to each other across the fluid circulation groove 20 may be arranged on a sealing face S of a stationary side seal ring 25. The number of the dynamic pressure generation mechanisms can be determined by the dimensions of the rotating side seal ring and the stationary side seal ring, the rotation speed, the pressure of the sealed fluid, etc.

In the above embodiment, the case where the sealed fluid of high pressure is present on the outer peripheral side is described. However, the present invention is not limited to this. For example, as shown in FIGS. 6 and 7, the present invention can be applied to an outside mechanical seal in which a sealed fluid to leak from the inner periphery of sealing faces toward the outer periphery is sealed with a high pressure fluid on the inner peripheral side.

Figure 6:
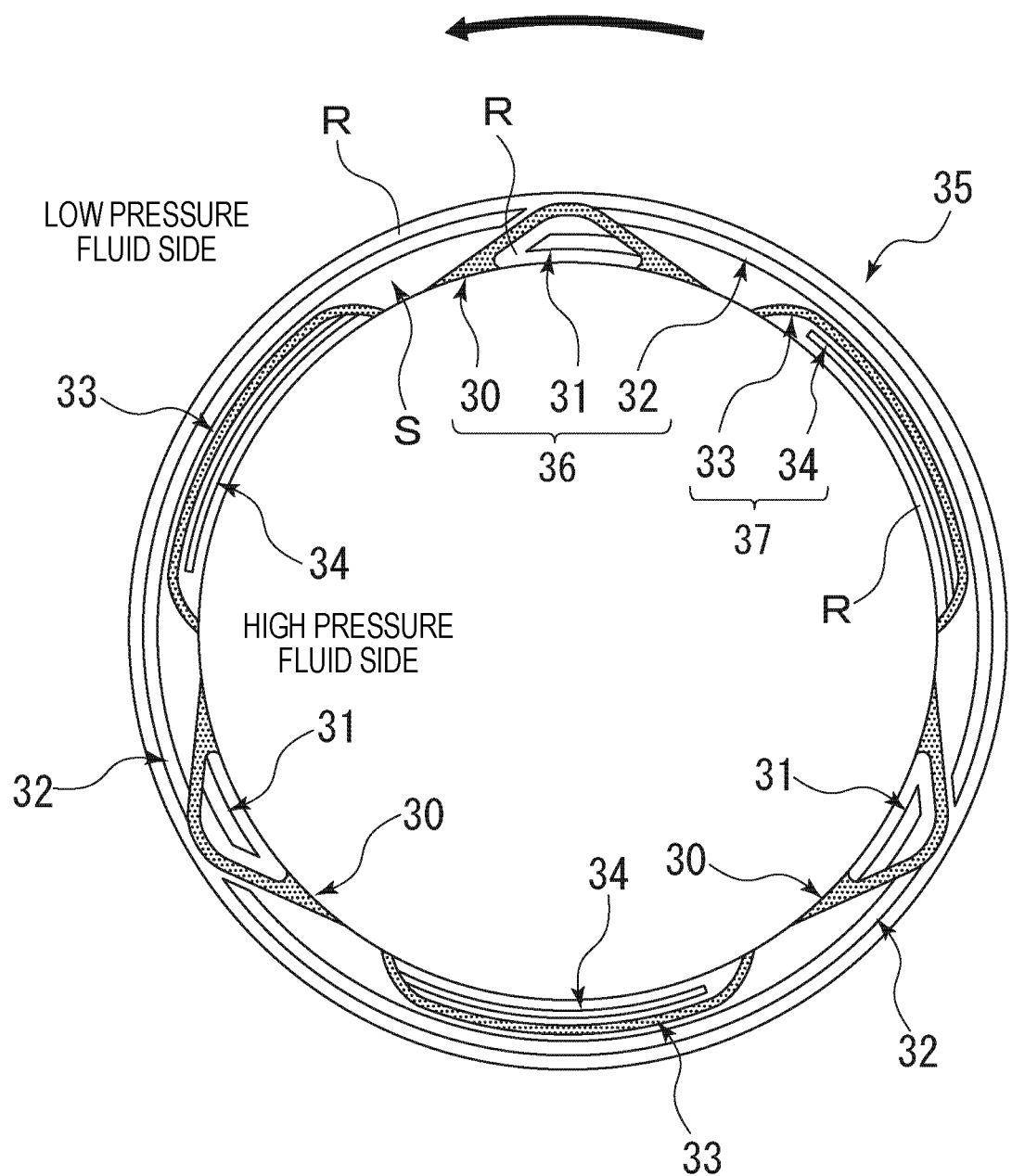
FIG. 6 is a view showing an embodiment in which three first dynamic pressure generation mechanisms each of which includes a first positive pressure generation mechanism and a negative pressure generation mechanism extending in the opposite directions to each other across a first fluid circulation groove, and three second dynamic pressure generation mechanisms each of which includes a second positive pressure generation mechanism communicating with a second fluid circulation groove are arranged alternately on a sealing face.

As shown in FIG. 6, three first dynamic pressure generation mechanisms 36 and three second dynamic pressure generation mechanisms 37 are arranged alternately on a sealing face S of a stationary side seal ring 35. Each of the first dynamic pressure generation mechanisms 36 includes a first fluid circulation groove 30, and a first positive pressure generation mechanism 31 and a negative pressure generation mechanism 32 circumferentially provided in the opposite directions to each other across the first fluid circulation groove 30. Each of the second dynamic pressure generation mechanisms 37 includes a second positive pressure generation mechanism 34 communicating with a second fluid circulation groove 33, the second positive pressure generation mechanism 34 being surrounded by the second fluid circulation groove 33. The configuration of the first dynamic pressure generation mechanisms 36 is the same as the configuration of the dynamic pressure generation mechanisms 17 of the embodiment of FIG. 3 and the dynamic pressure generation mechanisms 26 of the embodiment of FIG. 5. However, since the three first dynamic pressure generation mechanisms 36 shown in FIG. 6 are arranged on the sealing face S, an interval between the adjacent first positive pressure generation mechanisms 31, 31 is extended, and there is a possibility that a sufficient fluid lubrication state cannot be obtained between the adjacent first positive pressure generation mechanisms 31. Thus, by arranging the second dynamic pressure generation mechanism between the adjacent first fluid circulation grooves 30, 30, it is possible to increase a fluid film between the sealing faces, and improve a lubrication performance.

Specifically, each of the first fluid circulation groove 30 and the second fluid circulation groove 33 is formed by a pair of opening portions opened on a peripheral surface of the stationary side seal ring 35 on the high pressure fluid side, and a communication passage providing communication between the pair of opening portions, and isolated from the low pressure fluid side by the land portion R. The first positive pressure generation mechanism 31 (Rayleigh step) is arranged on the high pressure fluid side of the first fluid circulation groove 30, and the negative pressure generation mechanism 32 (reversed Rayleigh step) is extended to the vicinity of the adjacent first fluid circulation groove 30 on the low pressure fluid side of the first fluid circulation groove 30. Further, between the adjacent first fluid circulation grooves 30, 30, the second dynamic pressure generation mechanism including the second positive pressure generation mechanism 34 (Rayleigh step) which communicates with the second fluid circulation groove 33, the second positive pressure generation mechanism being surrounded by the second fluid circulation groove 33 is arranged. Thereby, an interval between the adjacent first positive pressure generation mechanisms 31 is largely extended, and even in a case where a sufficient fluid lubrication state cannot be obtained between the adjacent first positive pressure generation mechanisms 31, 31, the fluid of high pressure is supplied between the sealing faces by the second dynamic pressure generation mechanism, and it is possible to maintain a fluid lubrication state.

Figure 7:
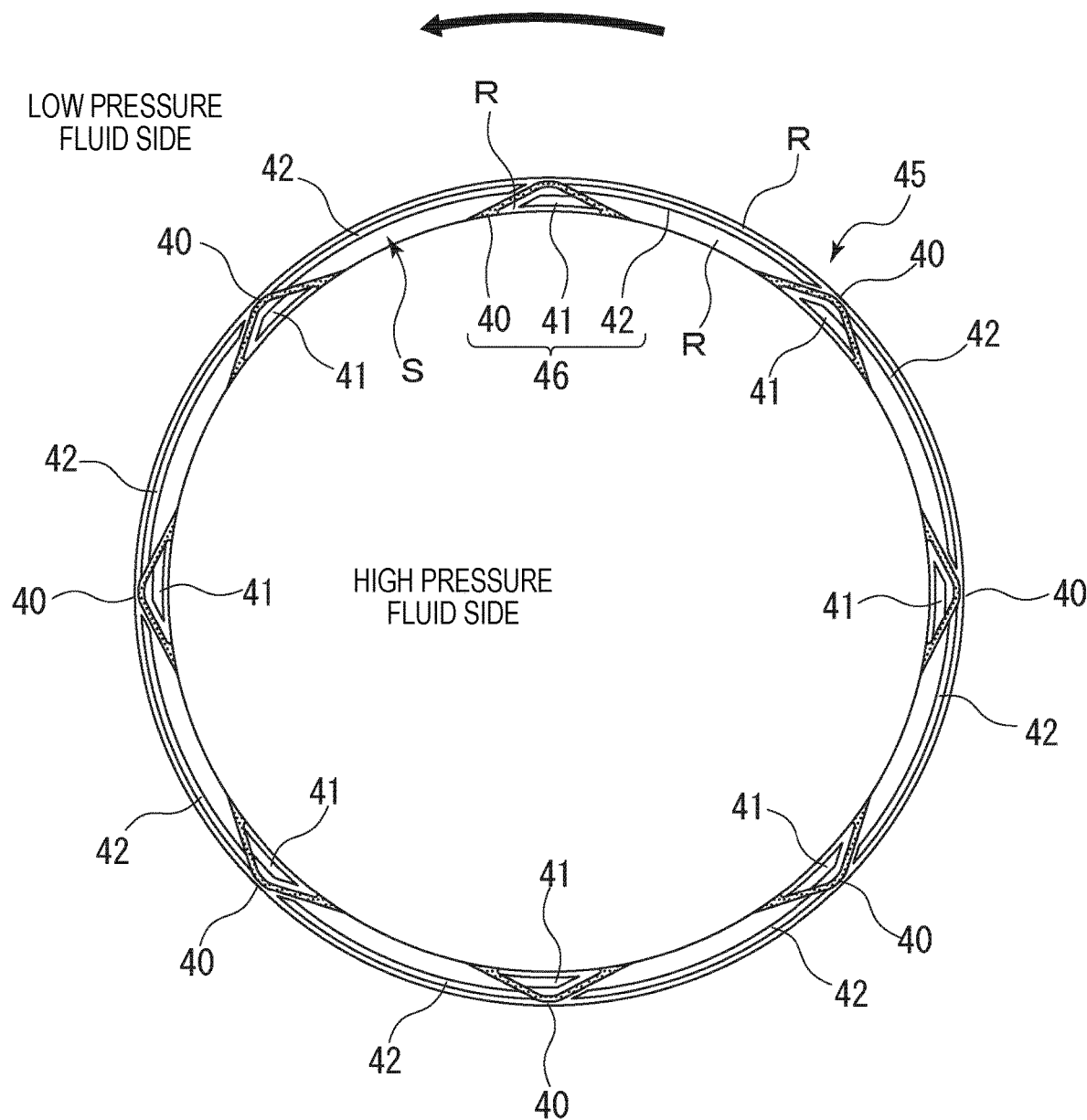
FIG. 7 is a view showing an embodiment in which eight dynamic pressure generation mechanisms each of which includes a positive pressure generation mechanism and a negative pressure generation mechanism extending in the opposite directions to each other across a fluid circulation groove are arranged on a sealing face of a stationary side seal ring, and width of the negative pressure generation mechanism is formed to be narrower than width of the positive pressure generation mechanism.

As shown in FIG. 7, eight dynamic pressure generation mechanisms 46 each of which includes a fluid circulation groove 40, and a positive pressure generation mechanism 41 and a negative pressure generation mechanism 42 circumferentially provided in the opposite directions to each other across the fluid circulation groove 40 are arranged on a sealing face S of a stationary side seal ring 45. The configuration of the dynamic pressure generation mechanisms in FIG. 7 is the same as the basic configuration of the dynamic pressure generation mechanisms of the embodiments of FIGS. 3, 5, and 6. However, in the embodiments of FIGS. 3, 5, and 6, in a case where reverse rotation occurs, large positive pressure is generated in the negative pressure generation mechanisms 12, 22, 32 (reversed Rayleigh step), and thus, there is a possibility that a leakage amount at the time of reverse rotation is increased. Therefore, in the dynamic pressure generation mechanisms in FIG. 7, by making the width of the negative pressure generation mechanism 42 (reversed Rayleigh step) narrower than the width of the positive pressure generation mechanism 41 (Rayleigh step), it is possible to decrease pressure generated in the reversed Rayleigh step 42 at the time of reverse rotation, and reduce the leakage amount at the time of reverse rotation.

Even in the embodiments of FIGS. 5 to 7, cavitation due to the pressure decrease is generated in the negative pressure generation mechanism. In a negative pressure region where cavitation is generated, silicate precipitate is easily accumulated. When silicon carbide of the substrate is exposed in the negative pressure region, silicate precipitate is easily deposited and attached. As a result, the sealing face S is damaged by deposition, precipitate is deposited on and attached to the positive pressure generation mechanism (Rayleigh step) and the negative pressure generation mechanism (reversed Rayleigh step), and functions of the positive pressure generation mechanism and the negative pressure generation mechanism are deteriorated, to be a factor to lower the sealing property. By coating the rotating side seal ring and the stationary side seal ring with the amorphous carbon film 8 whose content of silicon is 1.5 at % or less, the stationary side seal ring and the rotating side seal ring have almost no affinity with silicate, and it is possible to prevent deposition of a silicate compound contained in the sealed fluid on the sealing face.

Further, in the above embodiments, the Rayleigh step and the reversed Rayleigh step are provided on the sealing face as the dynamic pressure generation mechanisms. However, the present invention is not limited to this. Dimples 51 shown in FIG. 8 and spiral grooves 61 shown in FIG. 9 may serve as the dynamic pressure generation mechanisms.

Figure 8:
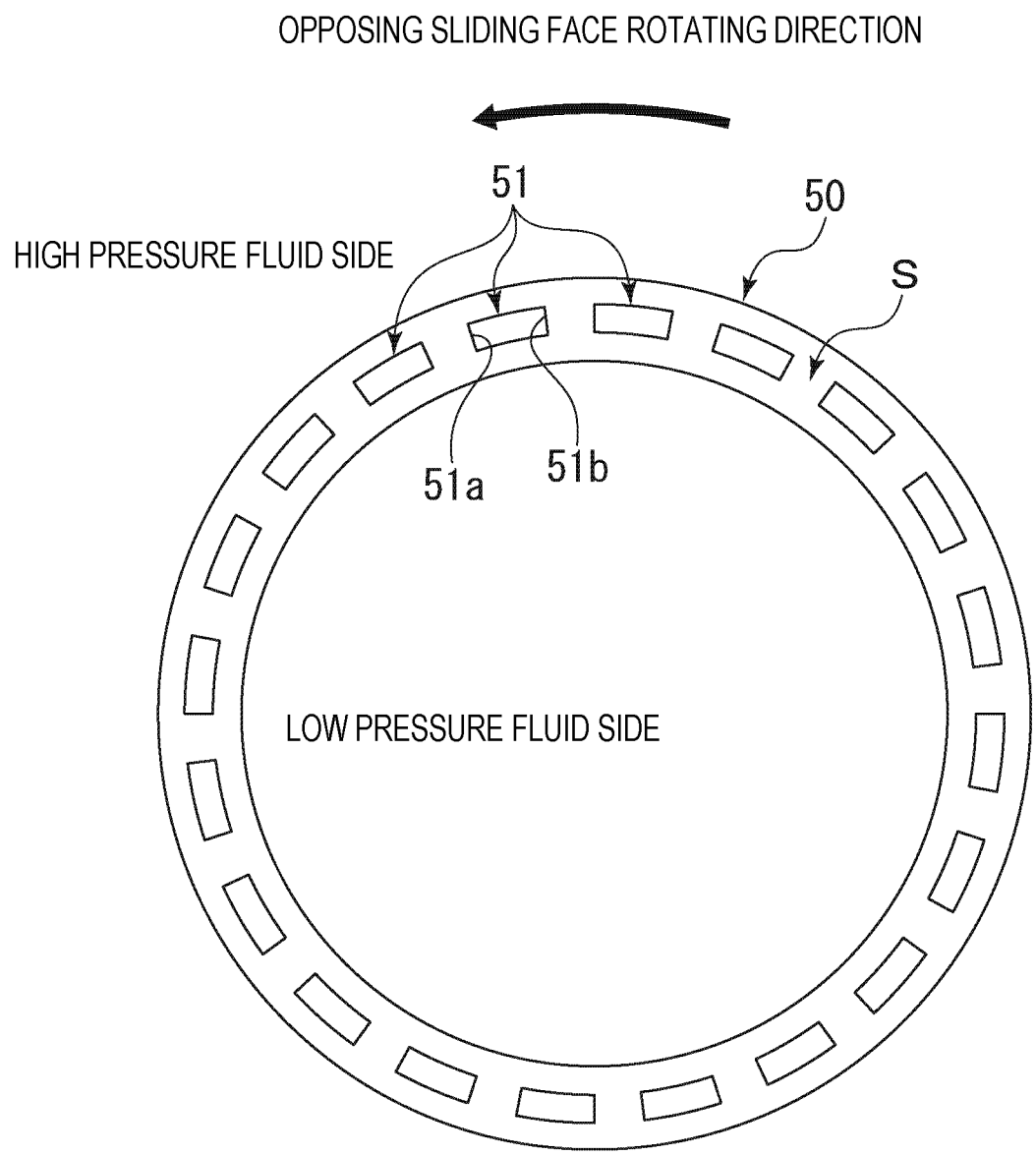
FIG. 8 is a view showing an embodiment in which plural quadrilateral dimples are provided in the circumferential direction on a sealing face of a stationary side seal ring.

For example, in FIG. 8, the plural quadrilateral dimples 51 are provided in the circumferential direction on a sealing face S of a stationary side seal ring 50. The dimples 51 do not communicate with the high pressure fluid side and the low pressure fluid side, and the dimples 51 are provided independently from each other. The number, the area, and the depth of the dimples 51 are set to be optimal values by conditions such as the diameter and the face width of the stationary side seal ring 50 and a pressure difference between the high pressure fluid side and the low pressure fluid side. However, dimples having a larger area and smaller depth are more preferable in terms of a fluid lubrication operation and liquid film formation.

In FIG. 8, as shown by an arrow, when the rotating side seal ring 3 is rotated and moved in the anti-clockwise direction with respect to the stationary side seal ring 50, a narrowed gap (step) 51a is formed on the downstream side of each of the dimples 51, and an extended gap (step) 51b is formed on the upstream side of each of the dimples 51 on the sealing face S of the stationary side seal ring 50. The fluid interposed between the sealing faces of the stationary side seal ring 50 and the rotating side seal ring 3 follows and moves in the moving direction of the rotating side seal ring 3 due to viscosity of the fluid. Thus, dynamic pressure (negative pressure) is generated due to presence of the extended gap (step) 51b, positive pressure is generated due to presence of the narrowed gap (step) 51a, and the fluid is supplied between the sealing faces S by the positive pressure. Thus, it is possible to maintain a fluid lubrication state.

Cavitation is generated in a negative pressure generation region on the upstream side in the dimple 51. Silicate precipitate occurs in a part of the negative pressure generation region, and precipitate is attached to and deposited on the negative pressure generation region and the land portion R, to be a factor to lower the sealing property. Therefore, the sealing faces S and the dimples 51 are coated with an amorphous carbon film whose content of silicon is 1.5 at % or less by using a hydrocarbon gas containing no silicon compound.

Thereby, the rotating side seal ring 3 and the stationary side seal ring 50 are coated with the amorphous carbon film 8 containing almost no silicon. Thus, the sealing faces of the stationary side seal ring and the rotating side seal ring have almost no affinity with silicate, and it is possible to prevent deposition of a silicate compound contained in the sealed fluid on the sealing faces. The shape of the dimples is not limited to a quadrilateral but may be a circle, an oval, or a triangle.

Figure 9:
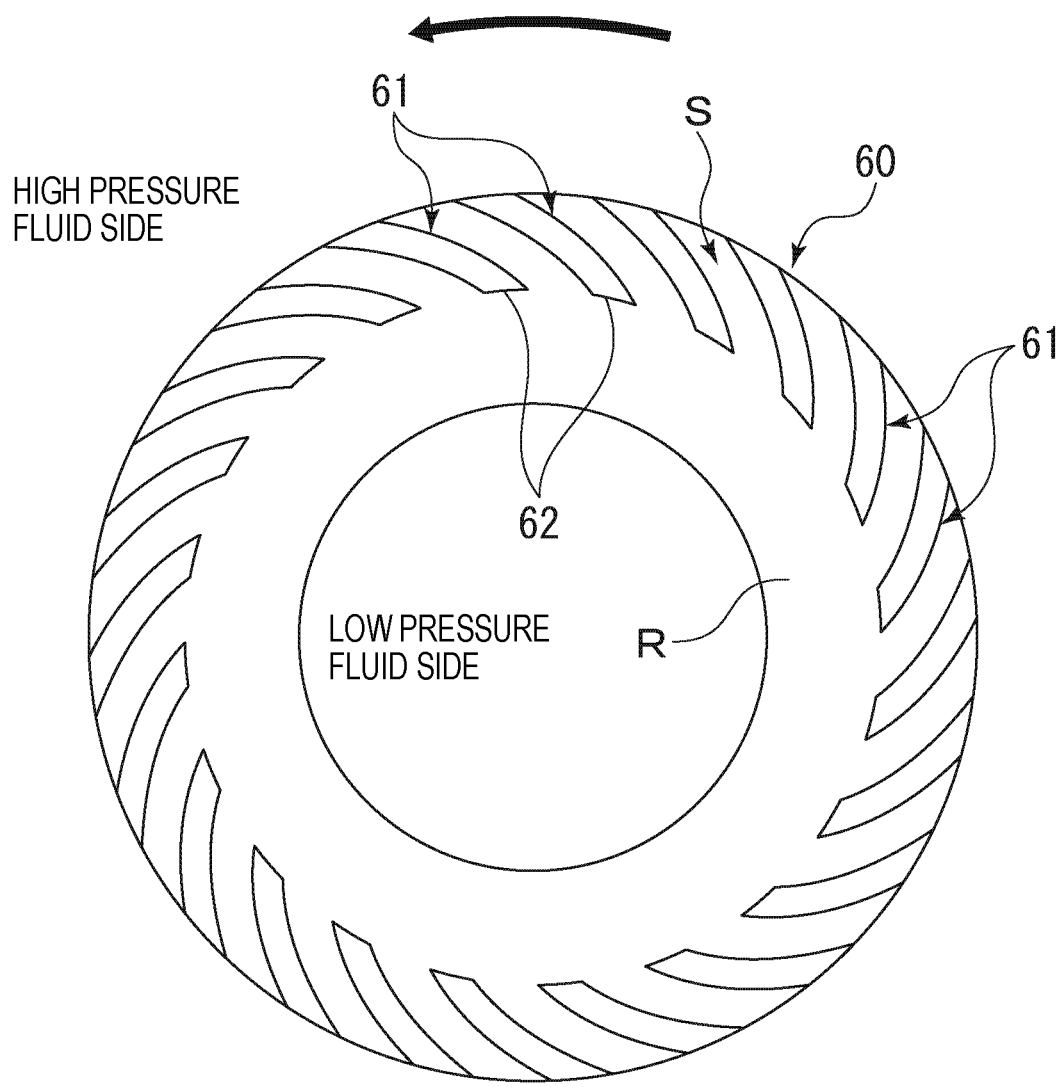
FIG. 9 is a view showing an embodiment in which plural spiral grooves are provided on a sealing face S of a stationary side seal ring.

As another type of dynamic pressure generation mechanisms, as shown in FIG. 9, the spiral grooves 61 may be provided on a sealing face S of a stationary side seal ring 60. Each of the spiral grooves 61 has an inclination angle to discharge the fluid to the high pressure fluid side by sliding with respect to the opposing sealing face, pushes the fluid back to the high pressure fluid side by a viscosity pump effect of the spiral groove 61, and prevents leakage.

Cavitation may be generated in a part of low pressure fluid side end portions (upstream side parts of a fluid flow following motion with respect to the opposing sealing face, that is, the inner peripheral side in FIG. 9) 62 of the spiral grooves 61. In a case where a silicate refrigerant is used as the sealed fluid, etc., precipitate occurs in the part of the low pressure fluid side end portions 62 of the spiral grooves 61 where cavitation is generated, and is attached to and deposited on the land portion R, to be a factor to lower the sealing property.

The sealing faces S and the spiral grooves 61 are coated with an amorphous carbon film whose content of silicon is 1.5 at % or less by using a hydrocarbon gas containing no silicon compound. Thereby, the rotating side seal ring 3 and the stationary side seal ring 60 are coated with the amorphous carbon film 8 containing almost no silicon. Thus, the sealing faces of the stationary side seal ring and the rotating side seal ring have almost no affinity with silicate, and it is possible to prevent deposition of a silicate compound contained in the sealed fluid on the sealing faces.

In the above embodiments, the example in which the sliding component is used for any of the pair of a rotating seal ring and a stationary seal ring in a mechanical seal device is described. However, the sliding component can also be utilized as a sliding component of a bearing to slide with a rotating shaft while sealing lubricating oil on one side in the axial direction of cylindrical sealing faces.

The amorphous carbon film is only required to be laminated on at least one of the sealing faces of the substrates of the rotating side seal ring and the stationary side seal ring, or may be laminated to cover the entire surfaces of the substrates of the rotating side seal ring and the stationary side seal ring. Further, the amorphous carbon film may be laminated to cover one of the sealing faces of the substrates of the rotating side seal ring and the stationary side seal ring, and the entire surface of the other substrate.

Further, in the above embodiments, the thickness of the amorphous carbon film 8 formed on the rotating side seal ring and the stationary side seal ring is 150 nm. However, the present invention is not limited to this. As long as an amount of silicon contained in the amorphous carbon film 8 is 1.5 at % or less, the thickness of the amorphous carbon film 8 may be changed in accordance with the dimensions of the rotating side seal ring and the stationary side seal ring, the rotation speed of the rotating side seal ring, and the type of the sealed fluid.

REFERENCE SIGNS LIST

- 1 rotating shaft
- 2 sleeve
- 3 rotating side seal ring
- 4 housing
- 5 stationary side seal ring
- 6 coiled wave spring
- 7 bellows
- 8 amorphous carbon film
- 10 fluid circulation groove (dynamic pressure generation mechanism)
- 11 positive pressure generation mechanism (dynamic pressure generation mechanism)
- 12 negative pressure generation mechanism (dynamic pressure generation mechanism)
- 15 stationary side seal ring
- 17 dynamic pressure generation mechanism
- 20 fluid circulation groove (dynamic pressure generation mechanism)
- 21 positive pressure generation mechanism (dynamic pressure generation mechanism)
- 22 negative pressure generation mechanism (dynamic pressure generation mechanism)
- 25 stationary side seal ring
- 26 dynamic pressure generation mechanism
- 30 first fluid circulation groove (dynamic pressure generation mechanism)
- 31 first positive pressure generation mechanism (dynamic pressure generation mechanism)
- 32 negative pressure generation mechanism (dynamic pressure generation mechanism)
- 33 second fluid circulation groove (dynamic pressure generation mechanism)
- 34 second positive pressure generation mechanism (dynamic pressure generation mechanism)
- 35 stationary side seal ring
- 36 first dynamic pressure generation mechanism
- 37 second dynamic pressure generation mechanism
- 40 fluid circulation groove (dynamic pressure generation mechanism)
- 41 positive pressure generation mechanism (dynamic pressure generation mechanism)
- 42 negative pressure generation mechanism (dynamic pressure generation mechanism)
- 45 stationary side seal ring
- 46 dynamic pressure generation mechanism
- 50 stationary side seal ring
- 51 dimple (dynamic pressure generation mechanism)
- 60 stationary side seal ring
- 61 spiral groove (dynamic pressure generation mechanism)

The invention claimed is:

1. A sliding component characterized by comprising an annular stationary side seal ring fixed to the stationary side and an annular rotating side seal ring to be rotated together with a rotating shaft, in which by relatively rotating opposing sealing faces of the stationary side seal ring and the rotating side seal ring, a silicate-containing sealed fluid present on one side in the radial direction of the relatively rotating sealing faces is sealed, characterized in that a diamond-like carbon film formed by using a hydrocarbon gas containing no silicon compound is provided on at least any one of the sealing faces of the stationary side seal ring and the rotating side seal ring, and the diamond-like carbon film contains silicon by 1.5 at % or less, said silicon, if any, originating in a material of the at least any one of the sealing faces, and further contains hydrogen by 1 at % to 20 at %, said material of the at least any one of the sealing faces being made of silicon carbide.

2. The sliding component according to claim 1, characterized in that a substrate of the stationary side seal ring or the rotating side seal ring is made of silicon carbide.

3. The sliding component according to claim 1, characterized in that at least one of the sealing faces of the stationary side seal ring and the rotating side seal ring includes a dynamic pressure generation mechanism that generates dynamic pressure by relative rotation of the stationary side seal ring and the rotating side seal ring.

4. The sliding component according to claim 2, characterized in that at least one of the sealing faces of the stationary side seal ring and the rotating side seal ring includes a dynamic pressure generation mechanism that generates dynamic pressure by relative rotation of the stationary side seal ring and the rotating side seal ring.

* * * * *